United States Patent [19]

Glocker

[11] Patent Number: 5,069,770

[45] Date of Patent: Dec. 3, 1991

[54] SPUTTERING PROCESS EMPLOYING AN ENCLOSED SPUTTERING TARGET

[75] Inventor: David A. Glocker, Henrietta, N.Y.

[73] Assignee: Eastman Kodak Company, Rochester, N.Y.

[21] Appl. No.: 556,135

[22] Filed: Jul. 23, 1990

[51] Int. Cl.[5] .................... C23C 14/34; C23C 14/35
[52] U.S. Cl. .................... 204/192.12; 204/298.06; 204/298.07; 204/298.12; 204/298.16; 204/298.21
[58] Field of Search .................... 204/192.12, 298.06, 204/298.07, 298.12, 298.16, 298.21

[56] References Cited

U.S. PATENT DOCUMENTS 3,354,074  11/1967  Kay .................... 204/298.16
4,094,764   6/1978  Boucher et al. .................... 204/298.06

FOREIGN PATENT DOCUMENTS 59-93878   5/1984  Japan .................... 204/298.12

Primary Examiner—Aaron Weisstuch
Attorney, Agent, or Firm—Warren W. Kurz

[57] ABSTRACT

A sputtering process employs a target which defines a hollow sputtering chamber having a relatively small orifice or slit through which particles, sputtered from the chamber-defining interior surfaces of the target, can exit the chamber and deposit on a workpiece or substrate disposed externally of the chamber and facing the orifice. According to a preferred embodiment, heating of the substrate by high energy secondary electrons exiting the sputtering chamber through the target orifice is significantly reduced by producing a magnetic field within the sputtering chamber, and by arranging a positively biased electrode (i.e. an anode) within the sputtering chamber opposite the target orifice. The magnetic field serves to prevent the escape of a substantial portion of such electrons from the target interior, and the anode performs the same function by collecting such electrons as they impinge thereon.

5 Claims, 2 Drawing Sheets

SPUTTERING PROCESS EMPLOYING AN ENCLOSED SPUTTERING TARGET

BACKGROUND OF THE INVENTION

This invention relates to the field of thin-film deposition and, more particularly, to improvements in sputtering processes for depositing thin-films on a workpiece or substrate.

In the published Japanese Patent Application 59-93878 by H. Yamamoto, there is disclosed a sputtering system which makes use of a substantially enclosed sputtering target which serves to contain a sputtering plasma during the sputtering process and thereby prevent the plasma from interfering with the sputtered film formation. The target itself is made of a single element (viz., tungsten or niobium), and it is mentioned that the target could be made in such a manner as to avoid the emergence of high energy electrons from the target. Such electrons are to be avoided because they often act to increase the temperature of the film-receiving substrate to an intolerably high level. But there is no disclosure in this reference of how the particular targets disclosed could be modified to achieve the goal of suppressing these secondary electrons.

SUMMARY OF THE INVENTION

In view of the foregoing, an object of this invention is to provide a process for sputter-depositing thin films from an enclosed target while maintaining the temperature of the film-receiving substrate at a relatively low level.

The sputtering process of the invention makes use of a sputtering target having walls which define a substantially enclosed sputtering chamber. One or more small orifices are formed in one of the chamber-defining walls to allow particles sputtered from the chamber's interior surfaces to escape the confines of the sputtering chamber and deposit on a substrate confronting the orifice. One or more electrodes, positively biased with respect to the target, are arranged within the sputtering chamber opposite the target orifice(s) to collect a portion of the high energy electrons produced during the sputtering process. Acting as a current drain, such electrodes reduce the number of high energy electrons leaving the sputtering chamber through the target's orifice(s). Preferably, a magnetic field is established within the sputtering chamber during the sputtering process, such field extending in a direction normal to the target base. Such field also decreases the number of high energy electrons from escaping from the sputtering chamber during sputtering.

The sputtering process of the invention will be better understood from the ensuing detailed description of preferred embodiments, reference being made to the accompanying drawings.

DETAILED DESCRIPTION OF PREFERRED EMBODIMENTS

Figure 1:
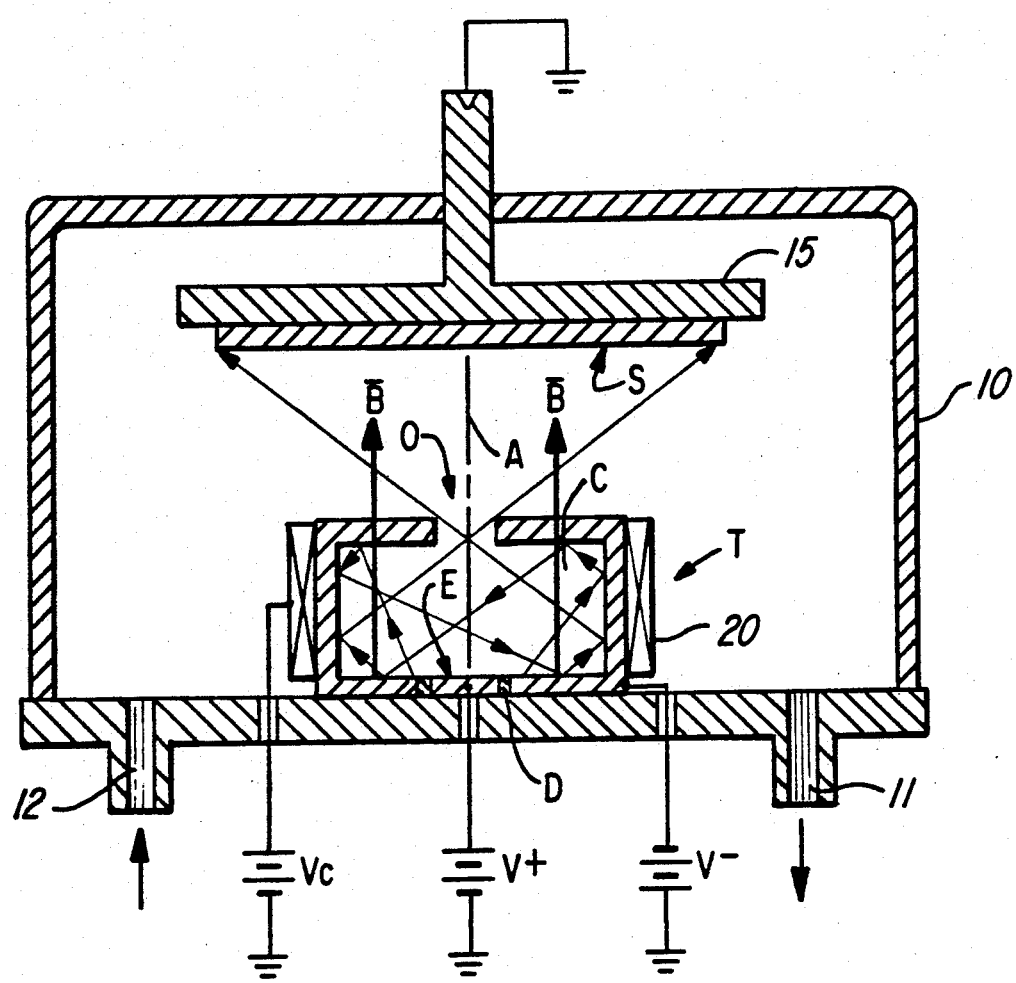
FIG. 1 is a schematic illustration of a sputtering apparatus adapted to carry out the sputtering process of the invention.

Referring now to the drawings, FIG. 1 illustrates a sputtering apparatus adapted to carry out the sputtering process of the invention. Such apparatus comprises a vacuum chamber 10 having a first aperture 11 through which gas can be evacuated from the chamber and a second aperture 12 through which a sputtering gas, such as argon, can be introduced. An electrically conductive substrate holder 15 serves to support a substrate S (or other workpiece) on which a thin film of the target material is to be sputter-deposited. Conventionally, the substrate holder is electrically grounded. Sputtering target T is made of an electrically conductive material, preferably a multi-element alloy. A negative power supply $V^-$, either AC or DC (as shown), serves to produce the requisite glow discharge (sputtering plasma) after the vacuum chamber has been evacuated and backfilled with the sputtering gas.

Figure 2:
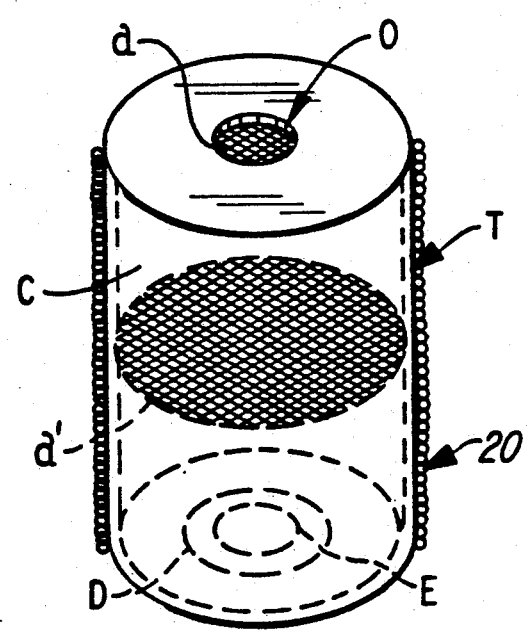
FIG. 2 illustrates a preferred configuration of the sputtering target shown in FIG. 1.

Sputtering target T has an enclosed or "hollow" configuration preferably having either a rectangular cross-section, or circular cross-section (as shown in FIG. 2). The walls of the target define a substantially enclosed sputtering chamber C having one or more relatively small orifices O formed in that wall of the target confronting the target. Preferably the cross-sectional area a of orifice O is less than 1/10 the largest cross-sectional area a' within the sputtering chamber. Orifice O may have any shape; however a circular orifice, as shown in FIG. 2, is preferred. Preferably, the bottom wall of the target supports an electrode E at a location directly opposite orifice O. Electrode E is electrically isolated from the target by a dielectric member D and is connected to a reference voltage $V^+$ which is positive with respect to power supply $V^-$. Preferably, the size and shape of the electrode substantially correspond to the size and shape of orifice O. Also preferred is that a magnetic field-producing means be provided to produce an axial magnetic field $\bar{B}$, parallel to the target axis A. Such field may be provided by a coil 20 wound about the side walls of the target with the coil axis being parallel with the target axis. Coil 20 is energized by an appropriate voltage source $V_c$.

When a sputtering plasma is produced within the chamber, the enclosed target effectively operates as an "effusion" cell, uniformly spraying particles (sputtered from the chamber interior) in all directions through the target aperture A. As explained below, however, the deposition rate achievable with the sputtering target of the invention is significantly higher than that of a standard effusion cell.

Because of the enclosed geometry, the sputtering plasma is confined to the sputtering chamber, except for a small fraction of sputtered particles which is allowed to escape the chamber via orifices O and deposit on the substrate. Owing to the enclosed geometry and the constant deposition and resputtering off the internal surfaces of the sputtering chamber, the distribution of all materials within the chamber is isotropic. This will be true regardless of the crystalline structure and surface morphology of the target. Sputtered material will escape the orifice with an angular distribution determined by the projected area of the opening in the particular direction. This will lead to a cosine distribution for all elements of the target and produce a uniform composition profile over the substrate surface.

A preferred enclosed target is in the form of a hollow cylinder with a circular hole in one end. The outside diameter of the cylinder is 7.4 cm, and the height is 4 cm. The inside diameter of the sputtering chamber is 4.6 cm, and the height of such chamber is 2 cm. The hole has a diameter of about 1 cm. In use, the vacuum system was pumped to a base pressure of $4 \times 10^{-7}$ Torr and backfilled to an operating pressure of $10 \times 10^{-3}$ Torr. To start the sputtering process, that is, to initially produce the glow discharge within the target's sputtering chamber, the pressure was momentarily raised to about $30 \times 10^{-3}$ Torr while applying a power of 250 watts to the target; immediately thereafter, the pressure was returned to $10 \times 10^{-3}$ Torr. The deposition was done at a constant power of 250 watts, and the voltage rose from 410 volts to 510 volts during the coating. Again, the substrate was in the form of a rectangular slide, 2.5 cm $\times$ 7.5 cm positioned about 5 cm above the target hole, with one end directly above the target hole's central axis.

As indicated earlier herein, a problem encountered in many sputtering applications is that of maintaining the temperature of the thin film-receiving substrate at a relatively low level during the sputtering process. In sputtering a target plate, high energy, secondary electrons are given off. When these electrons impinge upon the substrate, its temperature rises. According to one aspect of the invention, the number of these electrons reaching the substrate surface is minimized by the combination of anode E and the magnetic field-producing coil 20. The table below compares the substrate heat fluxes measured in electron-volts (eV) per arriving atom, for a copper target sputtered with different anode configurations and with and without a magnetic field. The measurements were made using a conventional calorimeter.

| Config- uration | Power | Magnetic Field | Anode (Dia; Bias) | Heat Flux |
|---|---|---|---|---|
| 1 | 750 Watts | Off | 1/4"; −25 Volts | 257 eV/atom |
| 2 | 500 Watts | Off | 1/4"; 0 Volts | 174 |
| 3 | 500 Watts | Off | 7/16"; 0 Volts | 169 |
| 4 | 500 Watts | 100 Gauss | 1/4"; 0 Volts | 128 |
| 5 | 500 Watts | 100 Gauss | 7/16"; 0 Volts | 46 |

Configuration 1 was a cylindrical target 3 inches long and 3 inches in diameter with a 3/4 inch opening. There was a 1/4 inch anode biased at −25 volts, so that the anode drew less than 10% of the cathode current. The remaining current had to flow out of the opening along with the sputter flux, making this condition substantially the same as that shown in the above-referenced Japanese application. The substrate heat flux was 257 eV/atom.

Configuration 2 was a cylindrical target 1.1 inches in diameter by 6 inches long with a 3/4 inch opening. There was a 1/4 inch grounded anode. The grounded anode reduced the heat flux to 174 eV/atom.

Configuration 3 was the same cylindrical target as configuration 2, but with a 7/16 inch diameter anode. The larger anode reduced the heat flux slightly to 169 eV/atom.

Configuration 4 was the same as configuration 2, but with a magnetic field applied parallel to the cylinder axis with a strength of approximately 100 Gauss. Use of the magnetic field with the smaller anode reduced the heat flux to 128 eV/atom.

Configuration 5 was the large anode coupled with the magnetic field. This combination was able to reduce the heat flux to 46 eV/atom.

The above data may be interpreted as follows:

In a conventional enclosed target, the plasma is sustained by the electrostatic confinement of secondary electrons emitted from the interior surfaces of the target. The mean free path for these electrons is quite large (several inches) at typical sputtering pressures, and some of them will escape the target interior source along with the sputtered material and heat the substrate. This is reflected in the data for configuration 1. When a small anode is placed inside the target interior, it will collect some of these high energy electrons by random impingement. It will also collect some fraction of the "ultimate" electrons, those which have undergone enough collisions to have lost most of their energy. However, the high energy electrons are primarily responsible for heating, and relatively few will be collected. This explains the minimal improvement with the anode alone, and the small effect that a somewhat larger anode has.

In the presence of an applied magnetic field, the secondary electrons move along the magnetic field lines with very high mobility, and across such field lines with very low mobility. This is the fundamental principle exploited in magnetron sputtering. Looking at FIG. 1, this means that if an axial magnetic field is produced within chamber C, electrons emitted from the interior side walls will be confined to within the Larmor radius of the wall (fractions of an inch in the example), while those emitted from either end wall will move freely to the other end. Therefore, electrons leaving the end opposite the opening from a point within the projected opening (projected along field lines) will exit the cathode at the full voltage. An anode at the far end will reduce this source of heat in proportion to the area of the anode compared to the area of the projected opening. This result can be seen in configurations 4 and 5. The most effective anode is one whose diameter is the diameter of the projected opening. If the anode is larger, it will intercept electrons which are not contributing to heating and reduce the confinement parameter of the target.

Figure 3:
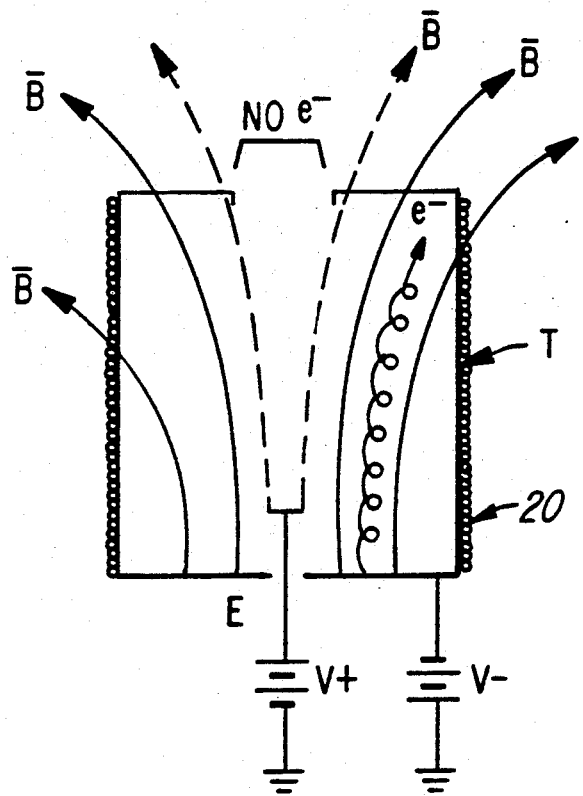
FIG. 3 is a schematic cross-sectional illustration useful in understanding the scope of the invention.

Referring to FIG. 3, it will be seen that the diameter of the anode E can be reduced if the magnetic field is caused to diverge from the target base. Such a diverging field can be produced by suitably tailoring and/or positioning the field-producing coil 20. So long as those field lines which pass through the target aperture also intercept the anode, there will be substantially no escape of secondary electrons.

In connection with the sputtering apparatus in FIG. 1, it has been found that the pressure in the vacuum chamber can be significantly reduced relative to the pressure within the target chamber by introducing the sputtering gas (e.g., argon) directly into the target through an aperture formed in one of its walls. This lower vacuum chamber pressure results in denser film growth, as is widely understood.

The invention has been described in detail with particular reference to certain preferred embodiments thereof, but it will be understood that variations and modifications can be effected within the spirit and scope of the invention.

I claim:

1. A sputtering process for depositing a thin-film of material on a workpiece, said process comprising the steps of:
   (a) providing a sputtering target having electrically conductive walls which define a substantially enclosed sputtering chamber, one of said walls having at least one relatively small orifice therein, said orifice having a cross-sectional area which is at least ten times smaller than the largest cross-sectional area of the sputtering chamber;
   (b) supporting a workpiece in a position confronting said orifice;
   (c) connecting said target to a reference voltage efficient to produce a sputtering plasma within said sputtering chamber to sputter particles from the chamber-defining walls of the target, a portion of such particles exiting said chamber through said orifice and depositing on the workpiece;
   (d) producing a magnetic field within said chamber in a direction substantially parallel to a line between the target and the workpiece; and
   (e) providing an electrode within said target and connecting said electrode to a voltage which is positive with respect to said reference voltage.

2. The process defined by claim 1 further comprising the step of positioning said electrode directly opposite said orifice in said one target wall.

3. The process defined by claim 1 further comprising the step of fabricating said target walls from a metallic compound.

4. A sputtering process for depositing a thin-film of material on a workpiece, said process comprising the steps of;
   (a) arranging a sputtering target within a vacuum chamber, said target having electrically conductive walls which define a substantially enclosed sputtering chamber, one of said walls having at least one relatively small orifice therein, said orifice having a cross-sectional area which is substantially smaller than the largest cross-sectional area of the sputtering chamber;
   (b) supporting a workpiece within said vacuum chamber in position confronting said orifice;
   (c) evacuating said vacuum chamber;
   (d) introducing a sputtering gas directly into said sputtering chamber, whereby the pressure within said sputtering chamber is higher than the pressure within said vacuum chamber; and
   (e) connecting said target to a reference voltage efficient to produce a sputtering plasma within said sputtering chamber to sputter particles from the chamber-defining walls of the target, a portion of such particles exiting said chamber through said orifice and depositing on the workpiece;
   (f) producing a magnetic field within said sputtering chamber in a direction substantially parallel to a line between the target and the workpiece; and
   (g) providing an electrode within said sputtering chamber and connecting said electrode to a voltage which is positive with respect to said reference voltage.

5. The process defined by claim 4 further comprising the step of positioning said electrode directly opposite said orifice in said one target wall.

* * * * *